(12) United States Patent
Hessler et al.

(10) Patent No.: US 9,880,522 B2
(45) Date of Patent: Jan. 30, 2018

(54) METHOD FOR CREATING A COMPONENT

(71) Applicant: The Swatch Group Research and Development Ltd, Marin (CH)

(72) Inventors: Thierry Hessler, St-Aubin (CH); Nicolas Rebeaud, Le Mont-sur-Lausanne (CH); Jean-Luc Helfer, Le Landeron (CH); David Richard, Yverdon-les-Bains (CH); Sebastien Graf, Le Mont-sur-Lausanne (CH)

(73) Assignee: The Swatch Group Research and Development Ltd., Marin (CH)

( * ) Notice: Subject to any disclaimer, the term of this patent is extended or adjusted under 35 U.S.C. 154(b) by 0 days.

(21) Appl. No.: 14/367,655

(22) PCT Filed: Dec. 20, 2012

(86) PCT No.: PCT/EP2012/076502
§ 371 (c)(1),
(2) Date: Jun. 20, 2014

(87) PCT Pub. No.: WO2013/092924
PCT Pub. Date: Jun. 27, 2013

(65) Prior Publication Data
US 2015/0003215 A1    Jan. 1, 2015

(30) Foreign Application Priority Data

Dec. 22, 2011 (EP) .................................. 11195421

(51) Int. Cl.
*G04B 31/00* (2006.01)
*G04B 31/06* (2006.01)
(Continued)

(52) U.S. Cl.
CPC .......... *G04B 31/06* (2013.01); *B23K 26/0063* (2013.01); *G04B 31/00* (2013.01);
(Continued)

(58) Field of Classification Search
CPC ........ G04B 31/00; G04B 31/02; G04B 31/06; G04B 31/012; G04B 31/016;
(Continued)

(56) References Cited

U.S. PATENT DOCUMENTS 3,300,260 A * 1/1967 Stern .................. G04B 31/0126
384/246
3,435,611 A * 4/1969 Hanaoka ................. F16C 17/10
368/324

(Continued)

FOREIGN PATENT DOCUMENTS

| CH | 321 946 | 5/1957 |
| CH | 690 013 | 3/2000 |

(Continued)

OTHER PUBLICATIONS

Stephane et al., English Translation of CH 700496, Sep. 15, 2010, full document.*

(Continued)

*Primary Examiner* — Amy Cohen Johnson
*Assistant Examiner* — Daniel Wicklund
(74) *Attorney, Agent, or Firm* — Oblon, McClelland, Maier & Neustadt, L.L.P.

(57) ABSTRACT

A method for manufacturing a component in a substrate including: a) modifying a structure of at least one region of the substrate to make the at least one region more selective; and b) chemically etching the at least one region to selectively manufacture the component.

27 Claims, 7 Drawing Sheets

(51) Int. Cl.
*G04B 31/02* (2006.01)
*G04B 31/08* (2006.01)
*B23K 26/00* (2014.01)
*G04B 31/004* (2006.01)
*F16C 17/06* (2006.01)
*F16C 17/03* (2006.01)
*F16C 33/10* (2006.01)
*G04B 15/14* (2006.01)
*G04D 3/00* (2006.01)

(52) U.S. Cl.
CPC ........... *G04B 31/004* (2013.01); *G04B 31/02* (2013.01); *G04B 31/08* (2013.01); *F16C 17/03* (2013.01); *F16C 17/06* (2013.01); *F16C 33/10* (2013.01); *G04B 15/14* (2013.01); *G04D 3/0069* (2013.01); *G04D 3/0071* (2013.01)

(58) Field of Classification Search
CPC ........ G04B 31/004; F16C 17/03; F16C 17/06; F16C 33/10; F16C 33/105; F16C 33/1015; F16C 33/102; F16C 33/1025; F16C 33/103; F16C 33/1035; F16C 33/104; F16C 33/1045; F16C 33/1055; F16C 33/106; F16C 33/1065; F16C 33/107; F16C 33/1075; F16C 33/108; F16C 33/109; F16C 33/1095
USPC .......................... 368/324–326; 384/401, 402
See application file for complete search history.

(56) References Cited

U.S. PATENT DOCUMENTS

| | | | | |
|---|---|---|---|---|
| 3,942,848 A | * | 3/1976 | Voumard | G04B 31/02 368/326 |
| 6,355,198 B1 | * | 3/2002 | Kim et al. | 264/259 |
| 8,501,584 B2 | * | 8/2013 | Marmy | G04B 13/026 368/124 |
| 9,353,789 B1 | * | 5/2016 | Gonzalez | F16C 17/04 |
| 2002/0139769 A1 | | 10/2002 | Helvajian et al. | |
| 2003/0190102 A1 | * | 10/2003 | Horng | F16C 33/1065 384/292 |
| 2003/0235385 A1 | | 12/2003 | Taylor et al. | |
| 2006/0187767 A1 | * | 8/2006 | Conus | G04B 31/04 368/324 |
| 2006/0192451 A1 | * | 8/2006 | Hong | F16C 17/026 310/90 |
| 2006/0257059 A1 | * | 11/2006 | Kubota | F16C 17/02 384/293 |
| 2010/0061192 A1 | | 3/2010 | Hessler et al. | |
| 2011/0034031 A1 | | 2/2011 | Kanamori et al. | |
| 2011/0127883 A1 | | 6/2011 | Kawaguchi et al. | |
| 2011/0164478 A1 | * | 7/2011 | Conus | G04B 31/004 368/324 |
| 2012/0082406 A1 | * | 4/2012 | Tung | F16C 17/02 384/397 |
| 2012/0155231 A1 | * | 6/2012 | Conus | G04B 31/04 368/324 |
| 2012/0263909 A1 | * | 10/2012 | Gluche | G04B 31/004 428/76 |
| 2014/0057104 A1 | * | 2/2014 | Landais | B82Y 10/00 428/399 |

FOREIGN PATENT DOCUMENTS

| | | | |
|---|---|---|---|
| CH | 700 528 | 9/2010 | |
| CH | 700496 B1 * | 9/2010 | ............ G04B 31/02 |
| EP | 1 818 736 | 8/2007 | |
| EP | 2 015 147 | 1/2009 | |

OTHER PUBLICATIONS

International Search Report issued Apr. 24, 2013, in PCT/EP12/076502, filed Dec. 20, 2012.

* cited by examiner

METHOD FOR CREATING A COMPONENT

This is a National phase application in the United States of International Patent Application PCT/EP2012/076502 filed Dec. 20, 2012 which claims priority on European Patent Application No. 11195421.0 filed Dec. 22, 2011. The entire disclosures of the above patent applications are hereby incorporated by reference.

The invention concerns a component element, said component includes at least one recess extending into said component from at least one of the surfaces of said component.

BACKGROUND OF THE INVENTION

It is known from the prior art that some microtechnical parts made of single crystal or polycrystalline materials are made by etching. This technique consists in taking the substrate to be etched and depositing a layer of photosensitive resin on top. A mask is placed on the resin and the whole assembly is exposed to light so that the photosensitive resin structure exposed to light is modified. This modified resin is eliminated by the action of a chemical element leaving the substrate bare at the places where the resin has been eliminated.

Subsequently, these bare regions of the substrate are chemically etched in order to create hollow portions. The chemical agent is chosen to etch only the material forming the substrate and not the unmodified photosensitive resin. The duration of this chemical etching step determines the dimensions of the hollow portions.

Similarly, it is possible to envisage making microtechnical parts by machining and/or polishing so that a drill or polisher may be used to form said parts.

A first drawback of this chemical etching technique is that it cannot produce hollow portions with vertical walls or sides. Indeed, the hollow portions obtained have inclined or rounded sides. This means that the surface of the hollow portion varies with depth, i.e. the surface becomes larger or smaller with the depth of the hollow. Generally the surface becomes smaller with depth. This observation means that theoretical calculations have to be adapted to obtain hollow portions with vertical sides. Further, this variation in the profile of the hollow portions between theory and practice results in a variation in characteristics.

A second drawback of these chemical etching or machining techniques is that they cannot create structures of complex depth. Indeed, chemical etching can only form hollow portions at the surface since the inclination of the sides means it is impossible to go deeper. For machining, the utilisation of a polisher and a drill are also unable to create complex inner structures. For example, the creation of a timepiece bearing made of single-piece ruby, i.e. formed of a single stone pierced with a blind hole, is possible, but the bearing cannot be lubricated unless the structures necessary for storing the lubricant are provided.

SUMMARY OF THE INVENTION

It is an object of the invention to overcome the aforecited drawbacks by proposing a manufacturing method for making a component having hollow portions with straight sides and inner structures and not simply at the surface.

The invention therefore relates to a method for manufacturing a component in a substrate characterized in that it includes the following steps:

a) modifying the structure of at least one region of the substrate in order to make said at least one region more selective;

b) etching said at least one region in order to selectively manufacture said component.

An advantage of the present invention is that it makes it possible to create recesses located underneath the surface since the material used is selected to be laser-transparent. This enables the laser to aim at any point on the surface or underneath the surface of the component. The material is thus made selective so that the chemical etch that follows is only performed on the material that has undergone modification by the laser. A method is thus obtained which allows complex inner recesses to be created.

Advantageous embodiments of the method of the present invention form the subject of the dependent claims.

In a first advantageous embodiment, the method further includes the step of:

c) releasing the component from said substrate.

In a second advantageous embodiment, the substrate is made of material transparent to the laser wavelength.

In a third advantageous embodiment, the laser pulse duration ranges from a femtosecond to a picosecond.

In a fourth advantageous embodiment, the substrate is made of single crystal material.

In a fifth advantageous embodiment, the substrate is made of polycrystalline material.

In another advantageous embodiment, the substrate is made of polymer.

In another advantageous embodiment, the substrate is made of an amorphous material such as ceramic or glass.

In another advantageous embodiment, the component is a timepiece component.

In another advantageous embodiment, the component is a timepiece bearing.

In another advantageous embodiment, the substrate includes a blind hole made prior to the step of modifying the structure.

In another advantageous embodiment, said bearing further includes at least one recess.

In another advantageous embodiment, said at least one recess is a blind hole.

In another advantageous embodiment, said at least one recess is used as a reservoir for storing a lubricant, said at least one recess extending at least from the surface of the hole.

In another advantageous embodiment, said at least one recess further includes at least one channel (202) connecting said at least one reservoir to said hole.

In another advantageous embodiment, said at least one recess is used to form an elastic structure (206).

In another advantageous embodiment, said elastic structure includes a central portion arranged so that the pivot-shank of an arbour can be inserted therein and at least one elastic arm extending from said central portion.

In another advantageous embodiment, the component is a resonator including a body used in deformation.

In another advantageous embodiment, the resonator includes a base from which extend at least two parallel arms each having an upper surface and a lower surface.

In another advantageous embodiment, the body is a bar coiled on itself forming a balance spring.

In another advantageous embodiment, the resonator further includes at least one recess made on one of the surfaces of said body.

In another advantageous embodiment, the component is a pallet-stone.

The present invention also concerns a timepiece component arranged to cooperate with an arbour, said component including a hole into which a pivot-shank of said arbour is inserted, characterized in that said component includes at least one recess extending into said component from at least one of the surfaces of the hole.

In a first advantageous embodiment, said at least one recess includes at least one reservoir intended to contain liquid.

In a second advantageous embodiment, said at least one recess further includes at least one channel connecting said at least one reservoir to said hole.

In another advantageous embodiment, said at least one recess extends to form an elastic structure.

In another advantageous embodiment, said recess is arranged so that the component includes a cylindrical part including an annular rim, a central portion and elastic arms connecting the central portion to the annular rim, the central portion including the hole.

In another advantageous embodiment, said component includes at least two recesses, at least one recess includes at least one reservoir intended to contain liquid and at least one recess extends so as to form an elastic structure.

The present invention also concerns a pallet-stone intended to cooperate with the teeth of an escape wheel of a timepiece movement, said pallet-stone including an escape plane, a locking plane and an impulse plane and at least one main channel connecting the escape plane to said locking plane, characterized in that said pallet-stone further includes a reservoir communicating with said channel so that all of the necessary lubricant can be stored in said at least one main channel and said reservoir.

In advantageous embodiment, the pallet-stone further includes at least one secondary channel connecting said at least one main channel to said impulse plane.

BRIEF DESCRIPTION OF THE DRAWINGS

The objects, advantages and features of the component according to the present invention will appear more clearly in the following detailed description of embodiments of the invention, given solely by way of non-limiting examples and illustrated in the annexed drawings, in which.

DETAILED DESCRIPTION OF THE INVENTION

Figure 1:
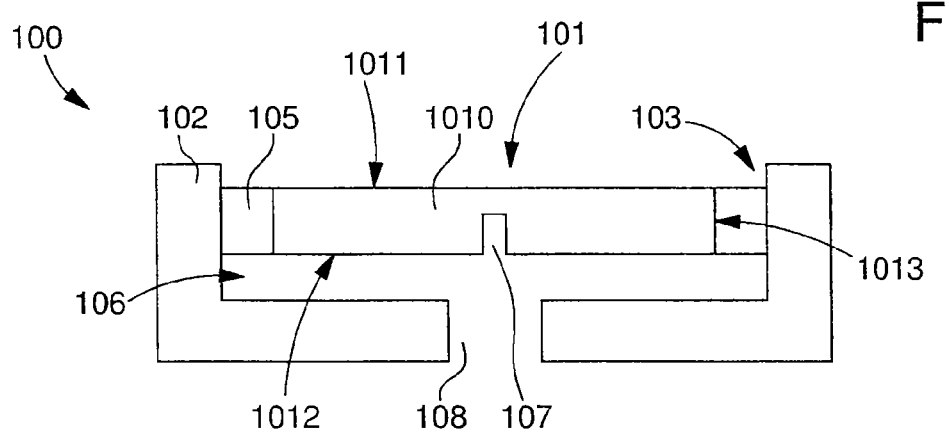
FIG. 1 shows a schematic view of the pivot system according to the present invention.

FIG. 1 shows a schematic view of a timepiece component according to the present invention.

In a first embodiment, the component 101 is a timepiece component. In the present case, component 101 is a timepiece bearing, namely an element used as a pivot for an arbour of said timepiece. Bearing 101 is a part of a pivot system 100 including a support 102 whose base has a hole 108 for the passage of the balance staff which ends in a pivot-shank. Support 102 includes a housing 103 for housing bearing 101. Bearing 101 is fixed inside housing 106 by means of attachment 105. This attachment means 105 may or may not be elastic.

Figure 2:
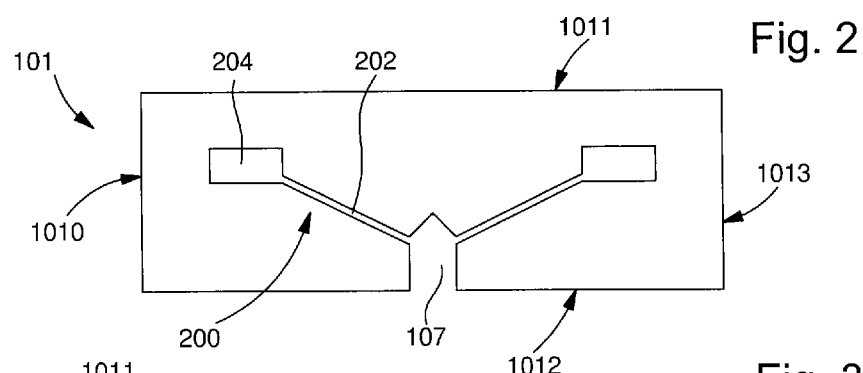
FIGS. 2 to 3 show schematic views of the first embodiment of the pivot system according to the present invention.

Bearing 101 according to the FIG. 2 embodiment, is a single-piece part which takes the form of a cylindrical or disc-shaped part 1010 including an upper surface 1011 and a lower surface 1012 and a circular wall 1013. This bearing further includes at least one recess 200 located on the lower surface 1012. This recess may be, for example, hole 107 into which the pivot-shank of the arbour is inserted. Of course, bearing 101 could have any shape, such as a parallelepiped or triangular shape or any other possible shape. Likewise, it is possible to envisage incorporating component 101 directly into a timepiece bridge. The bridge then acts as a substrate in which bearing 101 is made.

The present invention proposes to provide a manufacturing method for making component 101 and its recess 200. In the present case, the emphasis will be placed on the creation of recess 200.

Figure 9A:
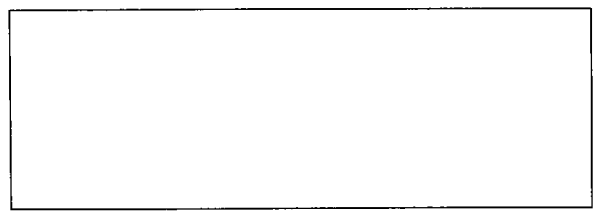
FIGS. 9A to 9D are schematic views of the steps of the method according to the present invention.

In a first step shown in FIG. 9A, there is provided a substrate, which is component 101 here, i.e. the bearing, with no recess 200 made therein. It is thus understood that bearing 101 is created beforehand. Bearing 101 is made by the most suitable method according to its constituent material, referred to as the "first material" here, such as for example machining or polishing.

Figure 9B:
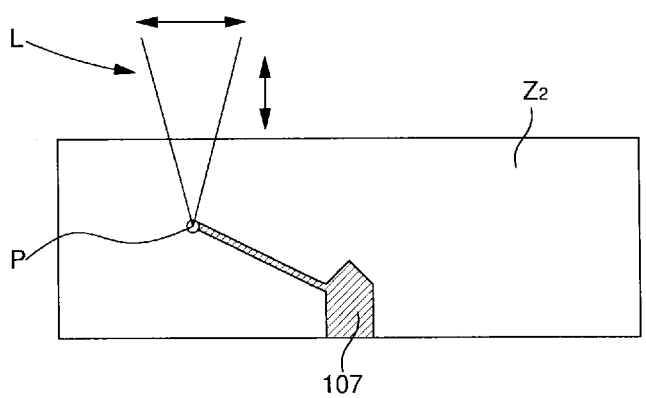
Figure 9C:
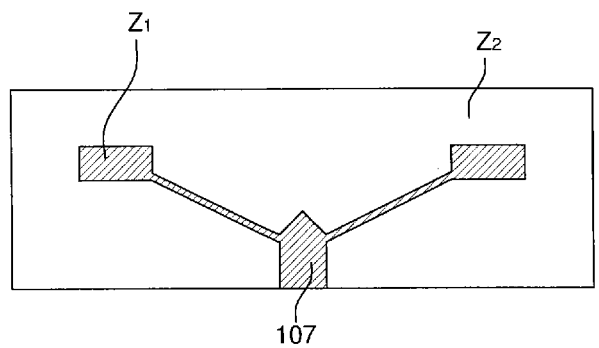

A second step consists in taking a laser (L) having a femtosecond pulse duration here, namely $10^{-15}$ of a second (typically 100 fs). The pulse duration may range from a femtosecond to a picosecond ($10^{-12}$ of a second). This laser (L) is then used to modify the structure of said bearing 101 as seen in FIG. 9B. To this end, the first material is chosen to be laser-transparent. This means that the focal point (P) of the laser (L) can aim at a point (P) which may be on or underneath the surface of bearing 101. For the laser (L) having a femtosecond pulse duration here, the first material may be a single crystal material such as quartz, sapphire or synthetic ruby, or a polycrystalline material, such as polycrystalline ruby, or an amorphous material like glass, such as silica or a ceramic. It is also possible to envisage making a polymer component. The focal point (P) is then moved towards bearing 101 on regions located on or underneath the surface of the bearing in accordance with a defined structure to be created. This is all carried out in a predetermined or desired sequence so as to cause a local modification of the structure of the material by multiphoton absorption. Indeed, modification of the structure of the material by multiphoton absorption requires a very high energy density. It is currently only possible to obtain such a high energy density with lasers whose pulse duration is very low, i.e. around a femtosecond or picosecond. These lasers are in fact capable of supplying this energy density at the focal point, i.e. where the energy density is highest. Bearing 101 is thus obtained, as shown in FIG. 9C.

Figure 9D:
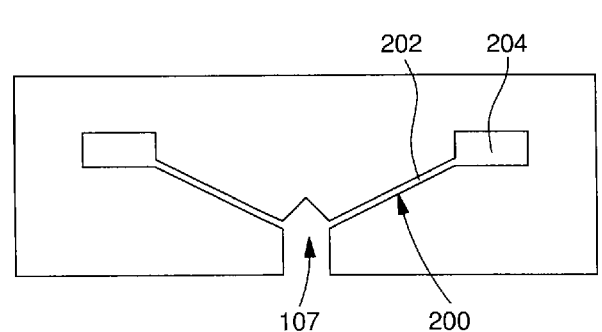

The third step consists in taking a chemical agent. This chemical agent is chosen to allow regions Z1 whose structure has been modified, to be dissolved more quickly than regions Z2 whose structure has not been modified. This means that the etching speed of regions Z1 whose structure has been modified by focal point (P) of the laser (L) is higher than the etching speed of regions Z2 whose structure has not been modified by the laser (L). In fact, the local modification of the structure by the focal point (P) of the femotosecond laser (L) means that it is possible to select a chemical agent which is more reactive to modified regions Z1 than to unmodified regions Z2. Consequently, dipping said bearing 101 for a determined time period in a bath formed of the chemical agent, dissolves all of the regions Z1 whose structure has been modified by focal point (P) of the laser (L). Of course, the dimensions of the component are calculated to take account of the etch of the chemical agent on the unmodified regions and thus not to excessively dissolve the regions whose structure has not been modified. The bearing 101 is thus obtained, as shown in FIG. 9D.

Further, it will be noted that in order for the dissolution of regions Z1 whose structure has been modified to occur, regions Z1 must be accessible to the chemical agent. It is thus understood that at least one surface or at least one region Z1 close to the surface is modified. Indeed, this method makes it possible to create inner structures, but the present method requires that the chemical agent has access to regions Z1 whose structure is modified. If a region Z1 whose structure is modified is at the surface, said chemical agent is able to dissolve modified regions Z1 immediately. However, it is possible to envisage having regions Z1 whose structure has been modified which are not located on the surface but just underneath the surface. The chemical agent then dissolves the few unmodified regions Z2 separating said chemical agent from modified regions Z1 and then dissolves said modified regions. Of course, this means that each recess 200 of bearing 101 must open onto a surface or be close to a surface. However, it is possible to envisage the various recesses being connected to each other by a common surface so that the dissolution is transmitted to the various recesses 200. Once all of modified regions Z1 have been dissolved, said bearing 101 is removed from the bath.

A fourth step consists in cleaning said bearing 101 in order to remove all of the residues of the chemical agent so that the chemical reaction is stopped for good.

An advantage of the present invention is that it is suited equally well to batch production and to large scale production. Indeed, the chemical etching step is suitable both for the batch production of several substrates at a time and for large scale production, i.e. a large number of substrates at a time.

The advantage of this method is thus that is possible to make recesses 200 of small dimensions immediately in the structure of bearing 101 which conventional machining cannot achieve. Indeed, a timepiece bearing 101 has very small dimensions of around a millimeter and it is too complex to mechanically machine recesses 200 in the structure. With the method of the present invention however, it becomes easy to hollow out the interior of bearing 101.

Of course, it will be understood that in the present case, bearing 101 without hole 107 into which the pivot-shank of the arbour is inserted, may be pre-machined using known methods and that the method of the present invention is used to make hole 107 and other recesses 200. However, it is possible to envisage using the method disclosed to make recesses 200 in bearing 101 in which hole 107 is pre-formed. It is possible for the method to be used, starting with a substrate, to make the entire bearing 101 immediately. The bearing is made from a substrate subjected to the method of the present invention.

It will also be understood that the substrate in which component 101 is made may be a timepiece bridge in which the bearing is immediately integrated so that the bridge and bearing assembly is in a single piece.

Figure 3:
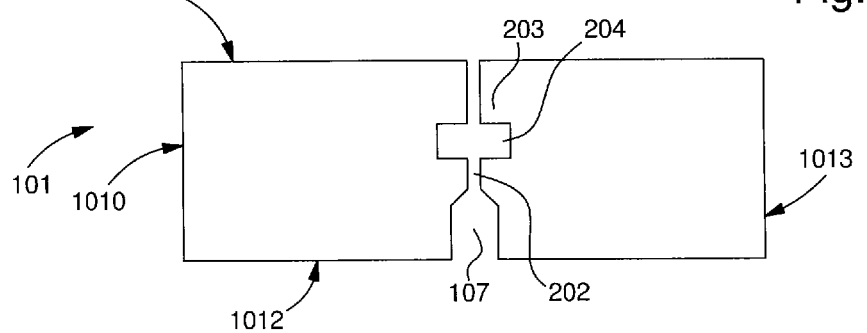

In a first variant seen in FIGS. 2 and 3, hole 107 into which the pivot-shank of the arbour is inserted, is pre-machined and the recess or recesses 200 made by the method of the invention are used for micro-fluid applications. This means that recess 200 is used to contain or allow the flow of a liquid.

It will thus be understood that, for the example of a bearing, this recess 200 may be used to store the lubricant used for lubricating the arbour inserted into hole 107 in bearing 101 via its pivot-shank. Indeed, lubrication makes it possible to decrease friction and thus decrease losses, thereby either improving the operating precision of the timepiece, or increasing the power reserve of the timepiece, or both. As explained above, it is impossible to store lubricant in a bearing 101 formed of a single stone. With the method of the present invention, it is therefore possible to store the lubricant inside the stone acting as bearing 101 by creating at least one recess 200.

This recess 200 extends from the surface of hole 107 towards the interior of bearing 101. This enables the lubricant stored inside said recess 200 to access hole 107 and thus the pivot-shank to be lubricated when the arbour rotates. This recess 200 is thus arranged to store lubricant which will be able to flow towards the pivot-shank of the arbour.

Advantageously, recess 200 includes at least one cavity 204 and may have at least one channel 202. Indeed, in a restricted space, said recess will be placed closer to the surface of hole 107 to obtain a more compact bearing 101. Conversely, if the space is not restricted, it is possible to envisage having at least one channel to connect hole 107 to cavity 204. In that case, the dimensions of channel 202 and of cavity 204 are calculated so that cavity 204 can store the quantity of lubricant necessary to lubricate bearing 101 properly and so that channel 202 can deliver the lubricant regularly and in sufficient quantities. If a single recess 200 with one channel 202 and one cavity 204 is insufficient, it is possible to provide several recesses 200 each including one cavity 204 and one channel 202 to connect said cavity 204 to hole 107. It is also conceivable for a recess 200 to be formed of several cavities 204 each associated with a channel 202 and for the various channels 202 to be joined at a junction point so that the lubricant is delivered to the pivot-shank through a single outlet. Channel 202 may also have a slope so as to convey the lubricant naturally from cavity 204 towards hole 107. The recess may also include an outlet channel 203 opening onto another surface of bearing 101 to facilitate the placing of lubricant in said cavity 204, as seen in FIG. 3. This configuration also facilitates the etch by the chemical agent and the cleaning of bearing 101.

Figure 4:
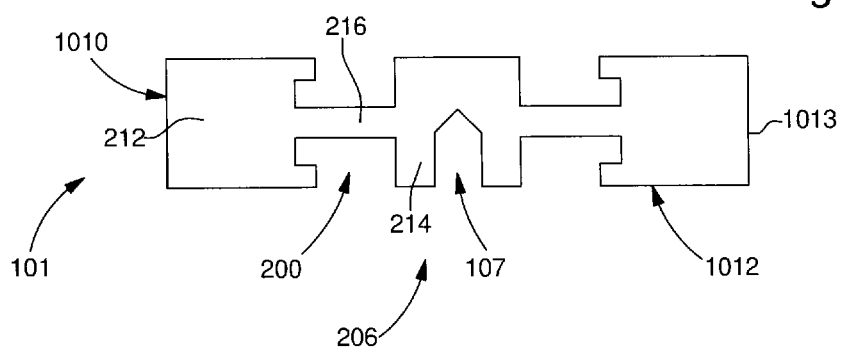
FIGS. 4 and 5 show schematic views of a first implementation of the second embodiment of the pivot system according to the present invention.
Figure 5:
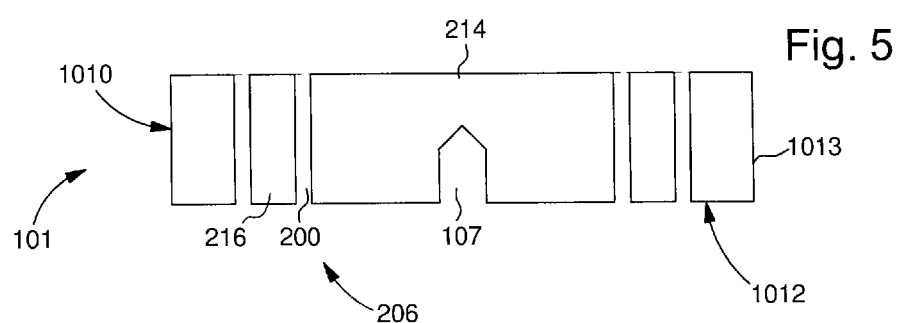
Figure 6:
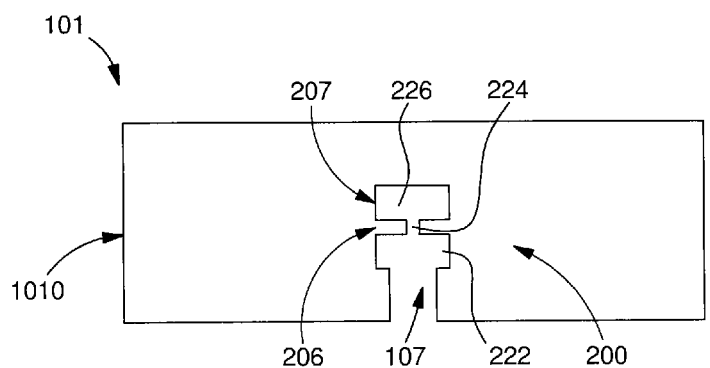
FIG. 6 shows a schematic view of a second implementation of the second embodiment of the pivot system according to the present invention.

In a second variant seen in FIGS. 4, 5, and 6, the recess 200 obtained is used to form a structure 206 that may be elastic.

According to a first implementation of this second variant seen in FIGS. 4 and 5, the cylindrical or disc-shaped part 1010 includes a central portion 214 connected, by at least one elastic arm 216, to a peripheral portion or annular rim 212 of bearing 101. Preferably, peripheral portion 212 and central portion 214 have the same height. Central portion 214 is cylindrical and includes hole 107 into which the pivot-shank of the arbour is inserted. Said at least one elastic arm 216 may be a strip whose flexibility is modified by varying its dimensions and thickness. Preferably, said at least one arm 216 takes the form of a bent arm whose thickness is equal to the height of the cylindrical central portion 214 as seen in FIG. 5. Preferentially, structure 206 includes three bent arms 216 whose points of attachment, respectively to rim 212 and to central portion 214, are angularly shifted by 120 degrees.

In a second implementation of this second variant seen in FIG. 6, the recess or recesses 200 form an elastic structure 206. This structure 206 includes a substantially cylindrical recess 200, which may or may not be a through recess, and including a wall 222 from which extend at least two strips 224. These strips 224 are preferably diametrically opposite and extend towards the axial centre of recess 207. These strips 224 separate said recess 200 into two parts 107, 226. A first part 107 opens onto the exterior of the bearing and is hole 107 which is used for receiving the pivot-shank of the arbour. The second part 226 of recess 200 is used for the clearance of strips 224. These at least two strips 224 are, by virtue of manufacture, flexible. This flexibility is permitted since strips 224 are long and thin so that, if the arbour moves, its pivot-shank comes into contact with strips 224. The latter are then deformed under the effect of the stress applied by the pivot-shank of the arbour so as to act as a shock absorber. The entire recess 200 is created simultaneously, i.e. the laser beam (L) is directed such that the focal point (P) sweeps the region defining said recesses in order to modify the structure of the region. The chemical agent then proceeds to dissolve the region defining said recesses. Preferably, the second part 207 includes four flexible strips 224. These strips may be in different horizontal planes.

Figure 7:
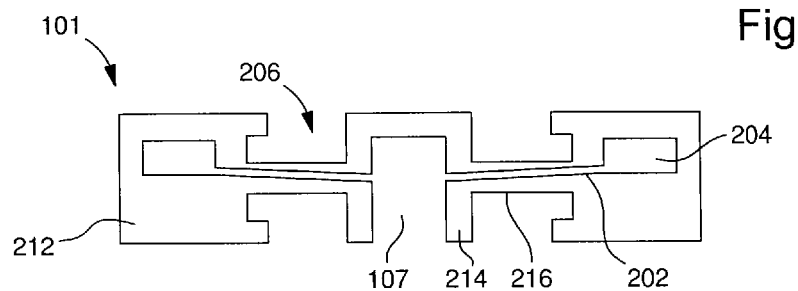
FIGS. 7 and 8 show schematic views of a first variant of the pivot system according to the present invention.
Figure 8:
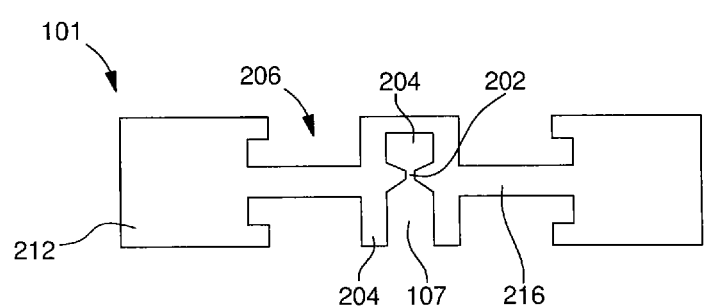

A third variant shown in FIGS. 7 and 8 combines the two preceding variants so that the bearing includes both at least one recess 200 forming an elastic structure 206 but also at least one recess 200 forming a cavity 204 for storing a lubricant. Indeed, bearing 101 could be arranged to include a structure formed of a central portion 214 connected to peripheral portion 212 of the bearing by at least one elastic arm 216 in order to absorb shocks but which also includes a cavity 204 used as a lubricant reservoir to improve the interaction between said bearing and the pivot-shank of the arbour. To achieve this, recess 200 used as lubricant cavity 204 may be placed in central portion 214 of elastic structure 216 as seen in FIG. 8. Advantageously, this recess 200 is placed above hole 107 so that the lubricant can flow by gravity or capillary action into hole 107. A narrow channel 202 may be provided for controlling the flow of lubricant. This recess 200 could also take the form of a circular groove located on the wall of hole 107.

However, it is conceivable for the recess or recesses 200 for storing a lubricant to be situated on peripheral portion 212 of said bearing and for the lubricant to be conveyed to hole 107 through at least one channel 202 as seen in FIG. 7. It is therefore understood that the channel or channels 202 pass through elastic arms 216 of elastic structure 206.

Figure 10:
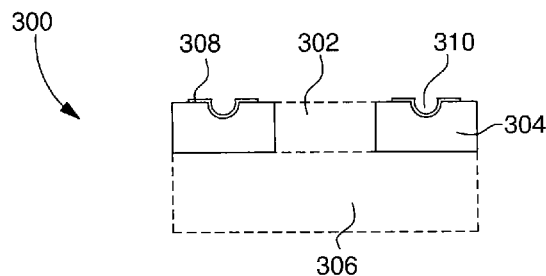
FIG. 10 shows a schematic front view of a resonator according to the prior art.
Figure 12:
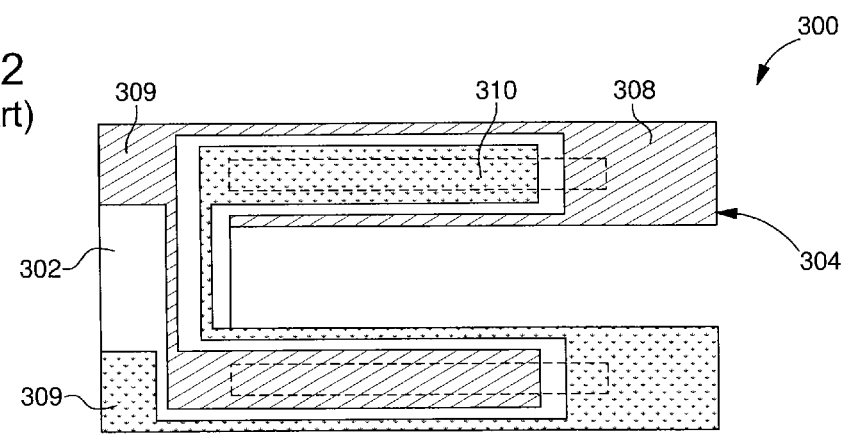
FIG. 12 shows a schematic top view of a variant of a resonator using the method according to the prior art.

In a second embodiment, the component manufactured using the method of the present invention is a resonator 300. This resonator has a body used in deformation. A conventional resonator shown in FIGS. 10 and 12 includes a base 302 placed on a stand 306 and from which extend at least two parallel arms 304. These two parallel arms carry metallisations which form two groups of electrodes 308 on the arms making it possible to subject the arms to electrical fields and make them vibrate. Resonator 300 further includes, on base 302, connection pads 309, respectively connected to groups of electrodes 308 as seen in FIG. 12. Each arm 304 includes an upper surface and a lower surface.

In order to improve the characteristics of resonator 300, it is known to form grooves 310 or channels on arms 304. These grooves or channels 310 increase the piezoelectric coupling resulting in an increased quality factor of resonator 300. This increased quality factor results in a decrease in electrical power consumption. This decrease in power consumption is a result of the decrease in electrical resistance representing losses in the equivalent circuit of resonator 300.

The manufacturing method according to the present invention may be used to make these grooves or channels 310. In the example described, each arm 304 includes at least one groove 310 each located on the upper surface of the corresponding arm 304.

To achieve this, it is first necessary to take resonator 300 before the electrodes are formed.

Then, the laser having a femtosecond pulse duration is used to locally modify the structure of arms 304. There are thus obtained regions of arms 304 whose structure is modified by multiphoton absorption, said regions having a predefined, preferably parallelepiped, and shape. This structural modification makes these regions more selective. This means that these regions are more reactive to certain chemical agents than the unmodified regions.

This enables a chemical etching step to be subsequently performed. This chemical etching step consists in dipping resonator 300 into a chemical solution chosen to selectively etch the regions modified by laser. However, it is possible to choose a chemical solution which will etch the modified regions more quickly than the unmodified regions. In that case, the dimensions of resonator 300 are defined so that the etch of the chemical agent on the unmodified regions is taken into account to avoid impairing the final dimensions.

Preferably, in the case where each arm 304 includes a single groove 310, the latter is placed centrally on arms 304, grooves 310 being placed on the same surface 314.

Figure 11:
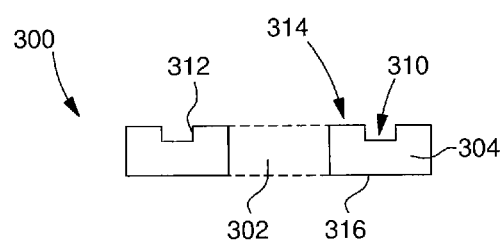
FIG. 11 shows a schematic front view of a resonator using the method according to the present invention.

The method according to the present invention makes it possible to create grooves or channels 310 offering greater piezoelectric coupling since the method can produce grooves 310 with more vertical sides 312 as seen in FIG. 11. This verticality significantly affects the coupling.

Figure 13:
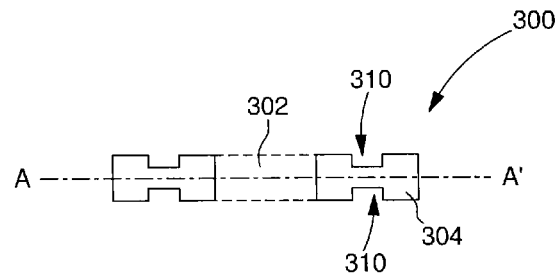
FIG. 13 shows a schematic front view of a variant of the resonator using the method according to the present invention.

In a first variant of this second embodiment seen in FIG. 13, each surface 314, 316 of each arm 304 includes a groove or channel 310. It is understood that for a resonator 300 having two arms 304, said resonator 300 has four grooves 310. There is thus one groove 310 on upper surface 314 of each arm 304 and one groove 310 on the lower surface 316 of each arm 304. In this variant, grooves 310 of each arm 304 are opposite with respect to the plane A-A' seen in FIG. 13.

Figure 14:
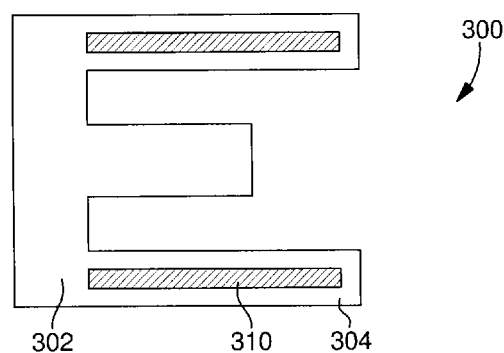
FIG. 14 shows a schematic top view of another variant of the resonator using the method according to the present invention.

In a second implementation seen in FIG. 14, it is possible for resonator 300 to include a third arm 304 so that resonator 300 has a similar shape to that of a trident. This third arm 304, which is central here, is used to secure resonator 300 and more specifically to modify its centre of gravity. Indeed, this third arm 304 is used as a securing point so that it is in contact with base 306 supporting resonator 300. This arrangement of the third arm 304 which acts as the central arm 304 makes it possible to centre the centre of gravity and obtain improved equilibrium of resonator 300. The method according to the present invention is thus used to make said resonator 300 from a substrate. The precision of the method according to the present invention enables complex shapes to be made. This possibility of forming the entire resonator 300 using the method of the present invention is advantageous since the contours and grooves 310 can be made in a single step. Of course, this is also possible with a standard resonator 300 having two arms 304.

Figure 18:
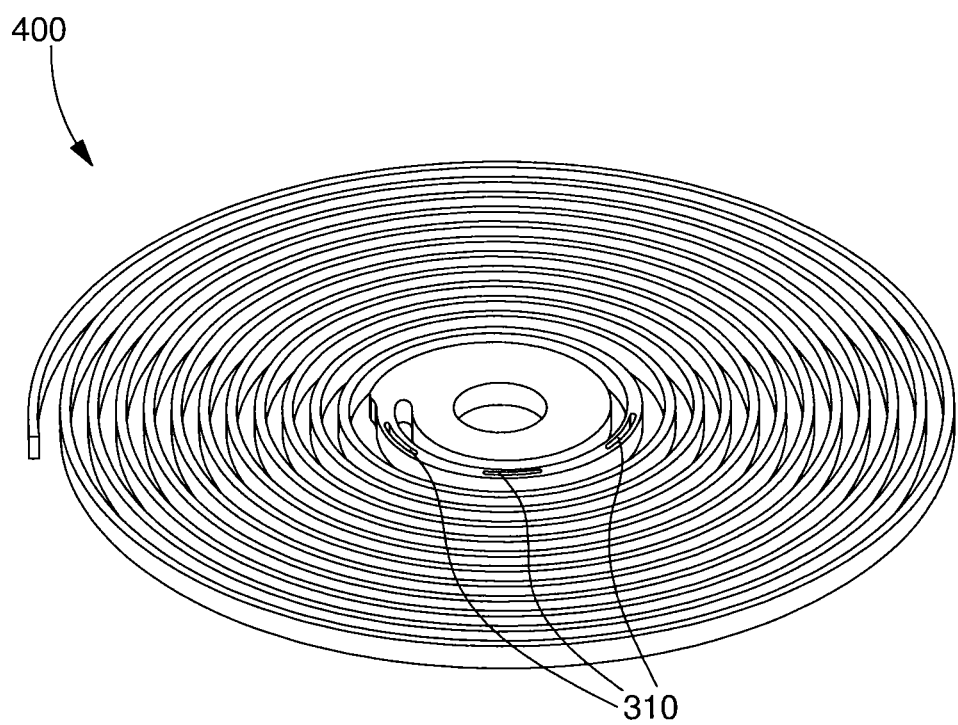
FIG. 18 is a schematic view of a spiral resonator according to the present invention.

Of course, it is understood that if the resonator takes the form of a balance spring 400, at least one recess 200 may be made on at least one of the surfaces of said spiral resonator and takes the form of a bath 310 as seen in FIG. 18.

Figure 15:
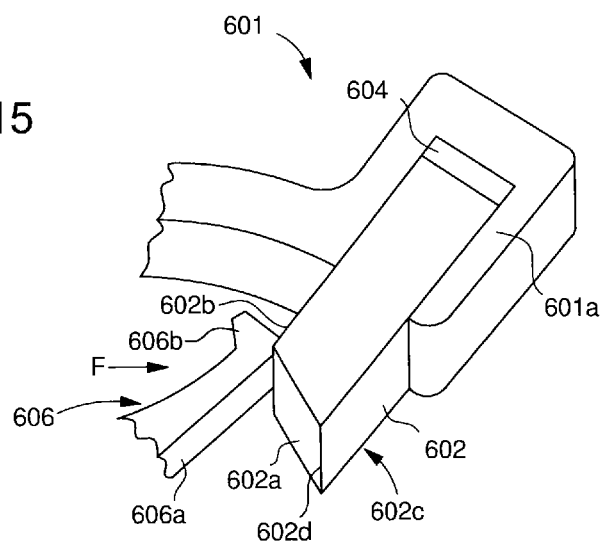
FIG. 15 is a schematic view of a known pallet-stone.

It will be understood that this manufacturing method may also be used to create other parts. In particular, it may be used to create ruby pallet-stones having at least one recess 200 used as a lubricant reservoir. Referring to FIG. 15, there is shown a pallet lever 601 having a conventional structure with two pallet-stones 602 (only the exit-pallet is shown in FIG. 15). Pallet stone 602 is generally a ruby part, all of whose surfaces are polished and which is driven into and bonded inside a housing 604 arranged in arm 601a of pallet lever 601. Pallet stone 602 includes an impulse plane 602a, a locking plane 602b and an escape plane 602c, the impulse plane 601a and escape plane 602c intersecting along an exit edge or impulse beak 602d. Impulse plane 602a and locking plane 602b respectively cooperate with the escape wheel teeth 606 and more particularly with locking plane 606a and locking beak 606b of teeth 606. The escape wheel 6 rotates in a conventional manner step-by-step in the direction of arrow F. The most important lubrication points are thus impulse plane 602a and locking plane 602b, so that the presence of lubricant is required between the escape wheel teeth and these planes during the various operating phases of the escapement.

Currently, lubrication consists in arranging a drop of lubricant on the escape wheel teeth, which does not ensure lubrication over a long period of time given that the lubricant is quickly driven towards locking plane 602b of pallet-stone 602 where it accumulates, and is therefore no longer available for the desired lubrication.

The present invention solves this problem by creating a recess 200 in the form of at least one channel 700 and at least one reservoir 702 for storing said lubricant. The method described above is used to accomplish this.

Figure 16:
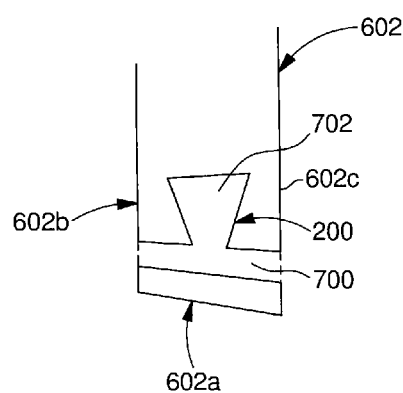
FIG. 16 is a schematic view of a pallet-stone according to the present invention.

The result, shown in FIG. 16, takes the form of a pallet-stone 602 including a main channel 700 connecting escape plane 602c to said locking plane 602b. Pallet-stone 602 further includes a recess 200 serving as reservoir 702 situated inside pallet-stone 602 and communicating with main channel 700. This reservoir 702 extends in a direction parallel to escape plane 602c and to locking plane 602b and away from impulse plane 602a. This reservoir 702 is sized to store all of the necessary lubricant. During the operation of the escapement, lubricant is sucked into main channel 700 by capillary action and emerges on locking plane 602b.

Figure 17:
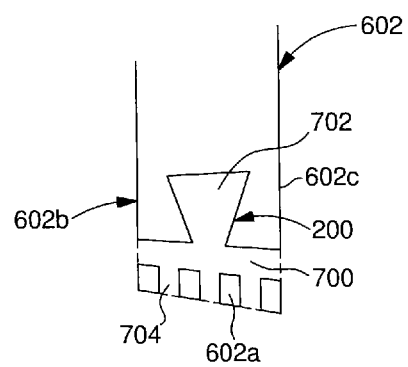
FIG. 17 is a schematic view of a variant of the pallet-stone according to the present invention.

In an advantageous variant, pallet-stone 602 further includes secondary channels 704 extending from said main channel 700 and opening onto locking plane 602a as seen in FIG. 17. These secondary channels 704 are consequently used for lubricating locking plane 602a, and the lubrication of the escapement is thereby improved.

The presence of this reservoir for storing all of the lubricant directly inside pallet-stone 602 eliminates the problem of lubricant being ejected in the event of a shock.

It will be clear that various alterations and/or improvements and/or combinations evident to those skilled in the art may be made to the various embodiments of the invention set out above without departing from the scope of the invention defined by the annexed claims.

The invention claimed is:

1. A method for manufacturing a timepiece component in a substrate, the method comprising:
   a) modifying a structure of at least one region of the substrate in order to increase an etching selectivity of said at least one region relative to another unmodified region of the substrate, said at least one region being underneath a surface of the substrate; and
   b) chemically etching said at least one region selectively, forming at least one recess, at least one reservoir, and at least one laterally closed channel in said at least one region of the substrate, the at least one recess being in fluid communication with the at least one reservoir via the at least one laterally closed channel, and the at least one reservoir being disposed at a portion of said at least one region that is deeper underneath the surface than a deepest portion of the at least one recess underneath the surface.

2. The manufacturing method according to claim 1, the method further comprising:
   c) releasing the timepiece component from said substrate.

3. The manufacturing method according to claim 1, wherein the structure of said at least one region is modified by a laser.

4. The manufacturing method according to claim 3, wherein the substrate is made of a material transparent to the laser wavelength.

5. The manufacturing method according to claim 4, wherein a pulse duration of the laser ranges from a femtosecond to a picosecond.

6. The manufacturing method according to claim 4, wherein the substrate is made of single crystal material.

7. The manufacturing method according to claim 4, wherein the substrate is made of polycrystalline material.

8. The manufacturing method according to claim 4, wherein the substrate is made of polymer.

9. The manufacturing method according to claim 4, wherein the substrate is made of an amorphous material or a ceramic or glass.

10. The manufacturing method according to claim 1, wherein the timepiece component is a timepiece bearing.

11. The manufacturing method according to claim 10, wherein the substrate includes a blind hole made prior to the structure modifying.

12. The manufacturing method according to claim 11, wherein said at least one recess is part of the at least one reservoir and is configured to store a lubricant, said at least one recess extending at least from a surface of the blind hole.

13. The manufacturing method according to claim 12, wherein said at least one recess is part of the at least one laterally closed channel, said channel connecting said at least one reservoir to said blind hole.

14. The manufacturing method according to claim 10, wherein said bearing further includes said at least one recess.

15. The manufacturing method according to claim 14, wherein said at least one recess includes a blind hole.

16. The manufacturing method according to claim 14, wherein said at least one recess is part of the at least one reservoir and is configured to store a lubricant, said at least one recess extending at least from a surface of the blind hole.

17. The manufacturing method according to claim 16, wherein said at least one recess is part of the at least one laterally closed channel, said channel connecting said at least one reservoir to said blind hole.

18. The method according to claim 14, wherein said at least one recess is used to form an elastic structure.

19. The method according to claim 18, wherein said elastic structure includes a central portion arranged so that a pivot-shank of an arbour can be inserted therein and at least one elastic arm extending from said central portion.

20. A timepiece component arranged to cooperate with an arbour, said component comprising:
   a hole into which a pivot-shank of said arbour is inserted; and
   at least one recess extending into said component from at least one surface of the hole, the at least one recess including at least one reservoir and at least one laterally closed channel, the at least one recess being in fluid communication with the at least one reservoir via the at least one laterally closed channel, and the at least one reservoir being disposed deeper underneath the at least one surface of the hole than a deepest portion of the hole into which the pivot-shank of said arbour is inserted.

21. The timepiece component according to claim 20, wherein said at least one reservoir is configured to contain a liquid.

22. The timepiece component according to claim 21, wherein said at least one laterally closed channel connects said at least one reservoir to said hole.

23. The timepiece component according to claim 22, wherein the at least one recess includes at least two recesses, one of the at least two recesses includes the at least one reservoir configured to contain a liquid and another of the at least two recesses extends so as to form an elastic structure.

24. The timepiece component according to claim 21, wherein the at least one recess includes at least two recesses, one of the at least two recesses includes the at least one reservoir configured to contain a liquid and another of the at least two recesses extends so as to form an elastic structure.

25. The timepiece component according to claim 20, wherein said at least one recess extends so as to form an elastic structure.

26. The timepiece component according to claim 25, wherein the at least one recess includes at least two recesses, one of the at least two recesses includes the at least one reservoir configured to contain a liquid and another of the at least two recesses forms the elastic structure.

27. The timepiece component according to claim 20, wherein the at least one recess includes at least two recesses, one of the at least two recesses includes the at least one reservoir configured to contain a liquid and another of the at least two recesses extends so as to form an elastic structure.

* * * * *